(12) United States Patent
Heydari Monfared (10) Patent No.: US 9,377,832 B1
(45) Date of Patent: Jun. 28, 2016

(54) DATA CENTER IN A RACK

(71) Applicant: Twitter, Inc., San Francisco, CA (US)

(72) Inventor: Ali Heydari Monfared, Albany, CA (US)

(73) Assignee: Twitter, Inc., San Francisco, CA (US)

( * ) Notice: Subject to any disclaimer, the term of this patent is extended or adjusted under 35 U.S.C. 154(b) by 332 days.

(21) Appl. No.: 13/843,578

(22) Filed: Mar. 15, 2013

(51) Int. Cl.
    *G06F 1/26* (2006.01)
    *G06F 11/20* (2006.01)
    *H05K 7/14* (2006.01)

(52) U.S. Cl.
    CPC ............ *G06F 1/263* (2013.01); *G06F 11/2015* (2013.01); *H05K 7/1457* (2013.01); *H05K 7/1492* (2013.01)

(58) Field of Classification Search
    CPC ........... G06F 1/18; G06F 1/181; G06F 1/183; G06F 1/189; G06F 1/26; G06F 1/263; G06F 1/28; G06F 1/30; G06F 11/2015; G06F 11/3062; H05K 7/14; H05K 7/1457; H05K 7/1492; Y04S 20/12; Y04S 20/18
    See application file for complete search history.

(56) References Cited

U.S. PATENT DOCUMENTS

| | | | |
|---|---|---|---|
| 2004/0070278 A1* | 4/2004 | Divan et al. | 307/64 |
| 2009/0174256 A1* | 7/2009 | Lanus et al. | 307/18 |
| 2011/0102996 A1* | 5/2011 | Janick et al. | 361/679.31 |
| 2011/0304211 A1* | 12/2011 | Peterson et al. | 307/48 |
| 2012/0267952 A1* | 10/2012 | Ballatine et al. | 307/26 |
| 2013/0080798 A1* | 3/2013 | Nakao | 713/300 |
| 2013/0163193 A1* | 6/2013 | Ballantine et al. | 361/679.47 |
| 2013/0198532 A1* | 8/2013 | Bailey et al. | 713/300 |
| 2014/0237290 A1* | 8/2014 | Uehara | 714/14 |
| 2014/0239718 A1* | 8/2014 | Giles | 307/26 |
| 2015/0092788 A1* | 4/2015 | Kennedy et al. | 370/419 |

\* cited by examiner

*Primary Examiner* — Dennis M Butler
(74) *Attorney, Agent, or Firm* — Osha Liang LLP (57) ABSTRACT

A server rack comprises a battery string connected to a controller and rectifier, server slots, a server load located in a first server slot of the server slots, a second server load stored in a second server slot of the server slots, a first AC power supply circuit supplying power to the first server load, a second AC power supply circuit supplying power to the second server load, a first DC power supply circuit supplying power to the first server load, a second DC power supply circuit supplying power to the second server load, a DC power distribution circuit connecting the rectifier to the first DC power supply circuit and the second DC power supply circuit, and an AC power distribution circuit connecting an incoming AC power supply to the first AC power supply circuit and the second AC power supply circuit.

22 Claims, 6 Drawing Sheets

DATA CENTER IN A RACK

SUMMARY

In general, in one aspect, the invention relates to a server rack. The server rack comprising: a battery string operatively connected to a controller and a rectifier; a plurality of server slots; a first server load located in a first server slot of the plurality of server slots; a second server load stored in a second server slot of the plurality of server slots; a first alternating current (AC) power supply circuit configured to supply power to the first server load; a second AC power supply circuit configured to supply power to the second server load; a first direct current (DC) power supply circuit configured to supply power to the first server load; a second DC power supply circuit configured to supply power to the second server load; a DC power distribution circuit operatively connecting the rectifier to the first DC power supply circuit and the second DC power supply circuit; and an AC power distribution circuit operatively connecting an incoming AC power supply to the first AC power supply circuit and the second AC power supply circuit.

In general, in one aspect, the invention relates to a server rack. The server rack comprising: a battery string operatively connected to a controller and a rectifier; a plurality of server slots; a first server load located in a first server slot of the plurality of server slots; a second server load stored in a second server slot of the plurality of server slots; a first alternating current (AC) power supply circuit located in a third server slot of the plurality of server slots and configured to supply power to the first server load; a second AC power supply circuit located in the third server slot and configured to supply power to the second server load; a first direct current (DC) power supply circuit located in a fourth server slot of the plurality of server slots and configured to supply power to the first server load; a second DC power supply circuit located in the fourth server slot and configured to supply power to the second server load; a DC power distribution circuit located in the fourth server slot and operatively connecting the rectifier to the first DC power supply circuit and the second DC power supply circuit; and an AC power distribution circuit located in the third server slot and operatively connecting an incoming AC power supply to the first AC power supply circuit and the second AC power supply circuit.

In general, in one aspect, the invention relates to a method of manufacturing a server rack for securing a first server load and a second server load. The method comprising: obtaining a frame comprising a plurality of server slots; installing a battery string, a controller, and a rectifier into the frame; installing a direct current (DC) power distribution circuit into the frame; and installing an alternating current (AC) power distribution circuit into the frame.

Other aspects of the invention will be apparent from the following description and the appended claims.

DETAILED DESCRIPTION

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention relate to a server rack and a method of manufacturing a server rack. The server rack includes a frame with multiple server slots storing server loads. Each server load receives power from an AC power supply circuit and a DC power supply circuit. The server rack also includes both a DC power distribution circuit electrically connecting the multiple DC power supply circuits to a battery string and an AC power distribution circuit electrically connecting the multiple AC power supply circuits to an incoming AC power supply. The AC power supply circuits, the DC power supply circuits, the DC power distribution circuit, the AC power distribution circuit, and the battery string may be arranged into various component groups, and each component group may be housed in various locations within the server rack including empty server slots, server slots having server loads, and/or one or more casings running along the side(s) of the server rack.

Figure 1:
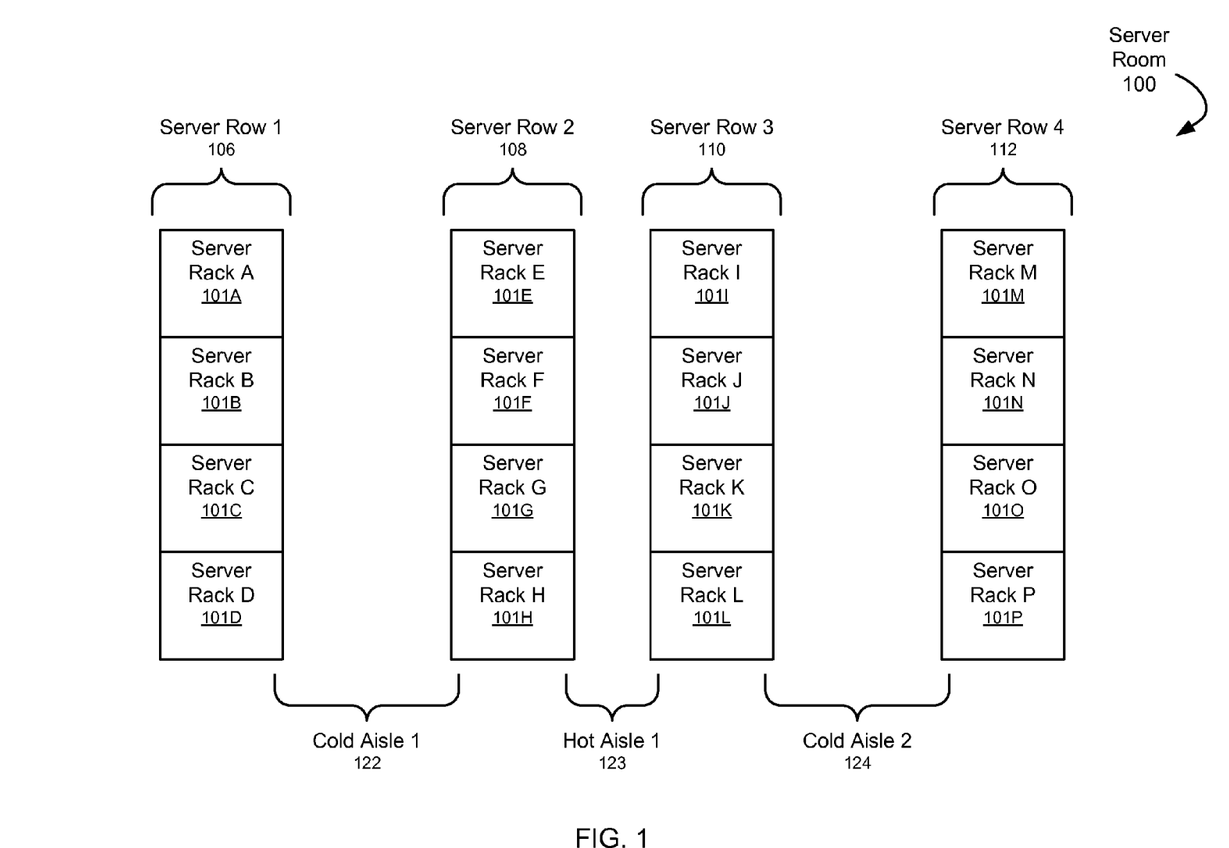
FIG. 1 shows a server room in accordance with one or more embodiments of the invention.

FIG. 1 shows a server room (100) in accordance with one or more embodiments of the invention. As shown in FIG. 1, the server room (100) has multiple server rows (i.e., Server Row 1 (106), Server Row 2 (108), Server Row 3 (110), Server Row 4 (112)). Moreover, each server row (106, 108, 110, 112) has multiple server racks. For example, server row 1 (106) has server rack A (101A), server rack B (101B), server rack C (101C), and server rack D (101D). Further, server row 2 (108) has server rack E (101E), server rack F (101F), server rack G (101G), and server rack H (101H). Further, server row 3 (110) has server rack I (101I), server rack J (101J), server rack K (101K), and server rack L (101L). Further still, server row 4 (112) has server rack M (101M), server rack N (101N), server rack O (101O) and server rack P (101P). Each server rack (101A-101P) stores one or more servers and/or power circuits.

Still referring to FIG. 1, server rows (106, 108, 110, 112) are separated by alternating cold aisles (e.g., Cold Aisle 1 (122), Cold Aisle 2 (124)) and hot aisles (e.g., Hot Aisle 1 (123)). Specifically, the servers in a server rack (101A-101P) draw in cool air from a cold aisle (122, 124) (i.e., to cool the server components) and expel air into a hot aisle (123). For example, the servers in server row 2 (108) draw in cool air from cold aisle 1 (122), while the servers in server row 3 (110) draw in cool air from cold aisle 2 (124). The servers in both server row 2 (108) and server row 3 (110) expel hot air into hot aisle 1 (123).

Figure 2:
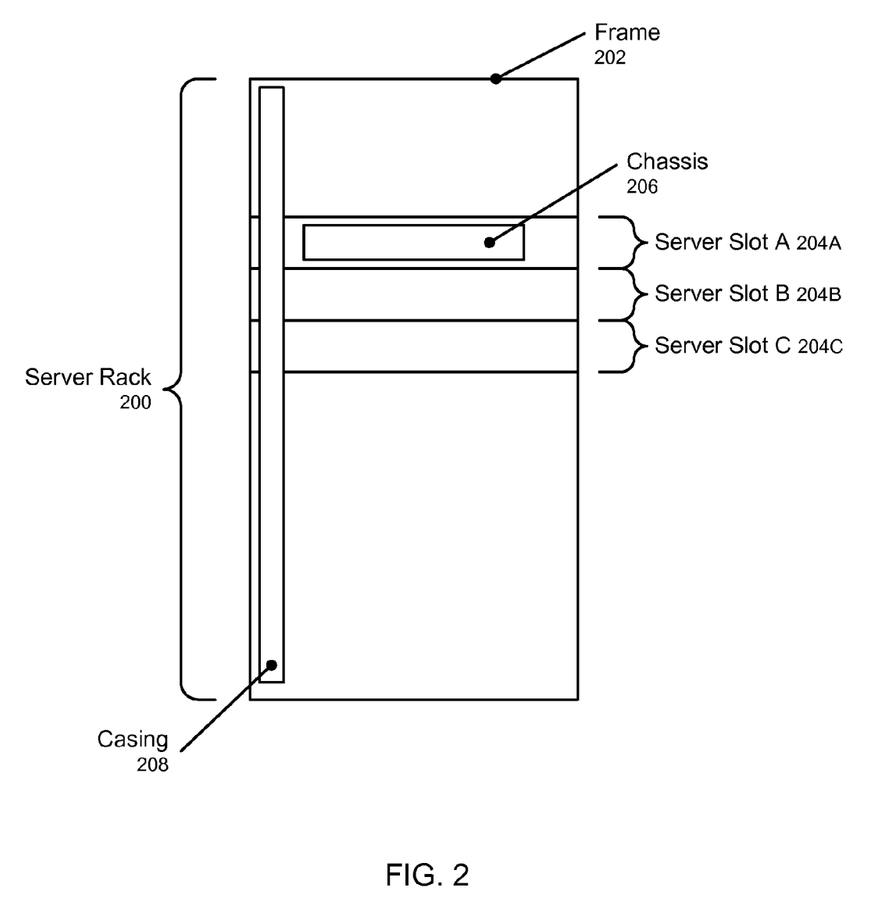
FIGS. 2-5 show server racks in accordance with one or more embodiments of the invention.

FIG. 2 shows a server rack (200) in accordance with one or more embodiments of the invention. The server rack (200) may correspond to any of the server racks (101A-101P), discussed above in reference to FIG. 1. As shown in FIG. 2, the server rack (200) includes a frame (202) with multiple server slots (i.e., Server Slot A (204A), Server Slot B (204B), Server Slot C (204C)). The frame (202) may be made of any material including plastics and/or metal alloys. In one or more embodiments of the invention, all the server slots (204A, 204B, 204C) are identical in size. In one or more embodiments of the invention, two or more of the server slots (204A, 204B, 204C) have different sizes. Although not shown in FIG. 2, the frame (202) may sit on wheels, making the server rack (200) mobile.

In one or more embodiments of the invention, each server slot (204A, 204B, 204C) is designed to hold a chassis. For example, as shown in FIG. 2, server slot A (204A) holds the chassis (206). The chassis (206) may be a box, shell, enclosure, container, receptacle, etc. that can be inserted, slid, fixed, screwed/snapped into a server slot (204A, 204B, 204C). Although FIG. 2 shows the chassis (206) as a rectangular prism, the chassis (206) may have any shape. The chassis (206) may be made of any material including plastics and/or metal alloys. The chassis (206) may have a lid/opening to access/install the contents of the chassis (206). The clearance between chassis in neighboring server slots may be less than 2 mm.

In one or more embodiments of the invention, the chassis (206) has grating/openings for cooling of the chassis' (206) contents. In one or more embodiments of the invention, the chassis (206) has one or more ports to form electrical connections with the chassis' (206) contents. In one or more embodiments of the invention, the chassis (206) is a server and thus houses server loads including, for example, circuit boards, processors, co-processors, memory, hard drives, fans, and Ethernet cards (discussed below). In one or more embodiments of the invention, the chassis (206) houses AC and/or DC power circuitry (e.g., power distribution circuits, battery strings, rectifiers, controllers, power supply circuits, etc.) (discussed below).

In one or more embodiments of the invention, the server rack (200) includes one or more casings (e.g., casing (208)). The casing (208) may run along the top, the bottom, or a side of the frame (202). In other words, the casing (208) may be secured to and/or suspended from the side(s), top, or bottom of the frame (202). The length of the casing (208) may correspond to the height of the frame (202). However, the casing (208) may have a length, width, depth, or dimension (e.g., diameter) of any magnitude. Although the casing (208) in FIG. 2 is shown as a rectangular prism, the casing (208) may have any shape (e.g., the casing (208) may be a tube). The casing (208) may be referred to as a power strip.

Like the chassis (206), the casing (208) may include openings/grating for cooling the contents of the casing (208). The casing (208) may have one or more ports for forming electrical connections with the contents of the casing (208). In one or more embodiments of the invention, the casing (208) houses AC and/or DC power circuitry (e.g., power distribution circuits, battery strings, rectifiers, controllers, power supply circuits, etc.) (discussed below).

Figure 3:
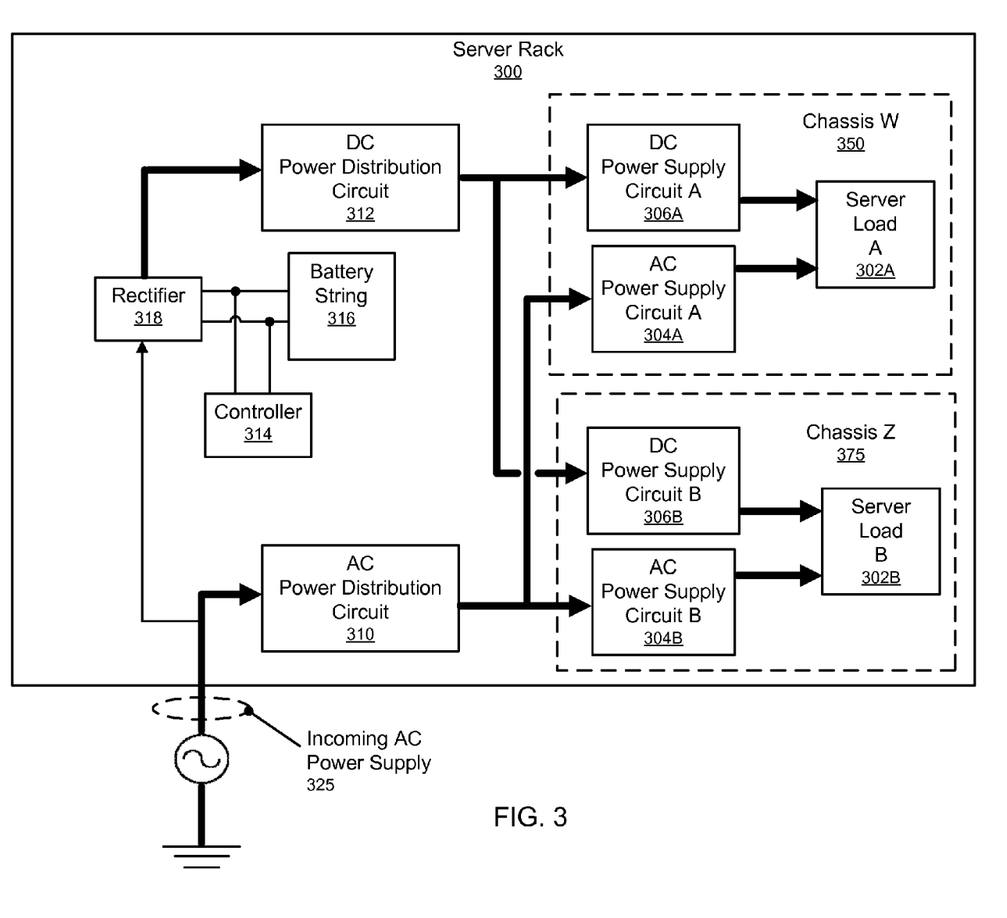

FIG. 3 shows a server rack (300) in accordance with one or more embodiments of the invention. The server rack (300) may correspond to the server rack (200), discussed above in reference to FIG. 2. The server rack (300) includes multiple chassis (i.e., Chassis W (350), Chassis Z (375)). Any chassis (350, 375) may correspond to the chassis (260), discussed above in reference to FIG. 2.

As shown in FIG. 3, chassis W (350) includes server load A (302A) and chassis Z (375) includes server load B (302B). Either server load A (302A) or server load B (302B) may correspond to a circuit board, a processor, a co-processor, a hard drive, memory, a fan, etc. As also shown in FIG. 3, chassis W (350) includes DC power supply circuit A (306A) and AC power supply circuit A (304A). Similarly, chassis Z (375) includes DC power supply circuit B (306B) and AC power supply circuit B (304B). The DC power supply circuits (306A, 306B) provide DC power to the server loads (302A, 302B). The AC power supply circuits (304A, 304B) provide AC power to the server loads (302A, 302B). In one or more embodiments of the invention, the server loads (302A, 302B) include circuitry to covert the AC power from the AC power supply circuits (304A, 304B) into DC power. In one or more embodiments of the invention, the server loads (302A, 302B) only utilize the DC power supply circuits (306A, 306B) when the AC power supply circuits (304A, 304B) are unavailable (e.g., power failure, taken off-line for maintenance, etc.). In one or more embodiments of the invention, the server loads (302A, 302B) utilize the DC power supplied by the DC power supply circuits (306A, 306B) even when the AC power supply circuits (304A, 304B) are operational.

Both the DC power supply circuits (306A, 306B) and the AC power supply circuits (304A, 304B) may have displays for displaying operational statistics (e.g., input/output voltage, input/output current, energy consumption, etc.) and/or may have network connections for remote monitoring/controlling of the operational statistics. Any chassis or casing having a DC power supply circuit (306A, 306B) may be referred to as a DC power supply unit (DC PSU). Similarly, any chassis or casing having an AC power supply circuit (304A, 304B) may be referred to as an AC power supply unit (AC PSU).

In one or more embodiments of the invention, the server rack (300) includes an AC power distribution circuit (310). The AC power distribution circuit (310) distributes an incoming AC power supply (325) to the multiple AC power supply circuits (304A, 304B). The incoming AC power supply (325) may correspond to any one type of AC power source and/or to any combination of AC power sources (e.g., public utility, a backup generator, etc.). The AC power distribution unit (310) may have a display for displaying operational statistics (e.g., input/output voltage, input/output current, energy consumption, etc.) and/or may have network connections for remote monitoring/controlling of the operational statistics. Any chassis or any casing having the AC power distribution circuit (310) may be referred to as an AC power distribution unit (AC PDU).

In one or more embodiments of the invention, the server rack (300) includes a battery string (316), a controller (314), and a rectifier (318). The battery string (316) is a source of DC power. The battery string (316) may include lead-acid, lithium-ion batteries, or any other type of battery. The rectifier (318) is operatively connected to the incoming AC power supply (325) and may be used to convert the AC signal of the incoming AC power distribution into a DC signal. Accordingly, the DC signal of the rectifier (318) may be used to charge the batteries in the battery string (316) and/or may be used as a DC power supply for other components/circuits in the server rack (300) (e.g., DC power distribution circuit (312)). The rectifier (318) may be used to shape any signal generated by the battery string (316). The controller (314) may be used to monitor and/or manage the charging of the battery string (316). The server rack (300) may include one or more rectifiers to convert the incoming AC power supply (325) to any DC voltage. The server rack (300) may include one or more power inverters to convert any DC source to any AC voltage. In addition to the rectifier (318) and the controller (314), the server rack (300) may include fuses, alarms, and/or relays. The rectifier (318), the controller (314), and/or power battery string (316) may have a display for displaying operational statistics (e.g., input/output voltage, input/output current, energy consumption, remaining battery life, etc.) and/or may have network connections for remote monitoring/controlling of the operational statistics.

In one or more embodiments of the invention, server rack (300) includes the DC power distribution circuit (312). The DC power distribution circuit (312) distributes a DC power supply (e.g., Battery String (316), Rectifier (318)) to the multiple DC power supply circuits (306A, 306B). The DC power distribution circuit (312) may have a display for displaying operational statistics (e.g., input/output voltage, input/output current, energy consumption, etc.) and/or may have network connections for remote monitoring/controlling of the operational statistics. The DC power distribution circuit (312) may convert any DC source (e.g., 380 VDC, 48 VDC, etc.) to any DC voltage required by the servers. Any chassis or any casing having the DC power distribution circuit (312) may be referred to as an DC power distribution unit (DC PDU).

In one or more embodiments of the invention, DC and AC power requirements of the server loads (302A, 302B) differ from the DC power sources and the incoming AC power supply (325). It is the responsibility of the power distribution circuits (310, 312) and the power supply circuits (304A, 304B, 306A, 306B) to transform the DC power sources (316, 318) and the incoming AC power supply (325) to conform with the power requirements of the server loads (302A, 302B).

In one or more embodiments of the invention, the incoming AC power supply (325) is a three-phase Y-connected 480 VAC power source. However, the power supply (325) may have any AC voltage (208V, 277V, 480V, etc.), any current, and any number of phases. In one or more embodiments of the invention, the rectifier (318) delivers 48 VDC to the DC power distribution circuit (312). However, the rectifier may deliver any DC voltage (208V, 277V, 480V, etc.), any current, and any number of phases. In one or more embodiments of the invention, the DC power supply circuits (306A, 306B) deliver 5 VDC, 12 VDC, or any DC voltage required by the server loads (302A, 302B).

Although FIG. 3 shows chassis Z (375) including DC power supply circuit B (306B) and AC power supply circuit B (304B), in one or more embodiments of the invention, DC power supply circuit B (306B) and AC power supply circuit B (304B) are external to chassis Z (375) (discussed below). Further, although FIG. 3 shows the DC power distribution circuit (312) and the AC power distribution circuit (310) external to chassis Z (375), in one or more embodiments of the invention, chassis Z (375) includes the DC power distribution circuit (312) and/or AC power distribution circuit (310).

Further, in one or more embodiments of the invention, each chassis (350, 375) in the server rack (300), in addition to having a server load (302A, 320B), has its own DC power distribution circuit, battery string, rectifier, inverter, and/or controller with an AC and/or DC feed to the server load.

Further still, in one or more embodiments of the invention, the server rack (300) includes daisy-chained power distribution among the server nodes. Specifically, a DC feed from the server PDU to the first server, then from the first server to the second server, then from the second server to the third server, and so forth.

Figure 4:
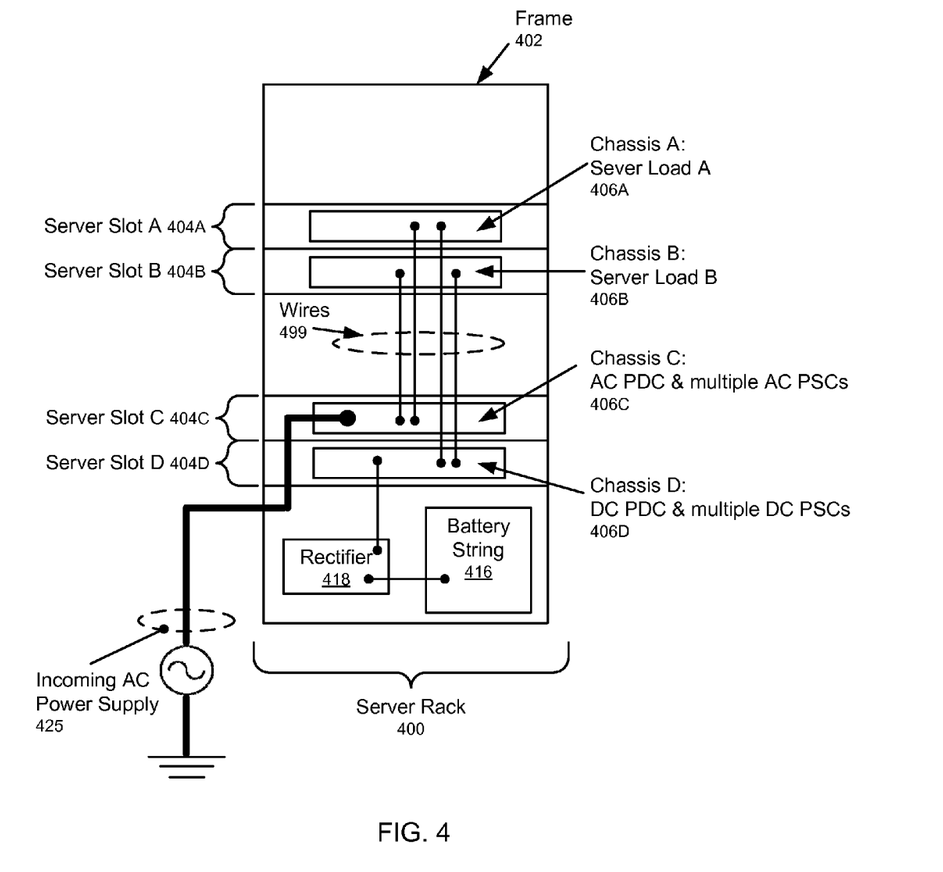

FIG. 4 shows a server rack (400) in accordance with one or more embodiments of the invention. The server rack (400) may be essentially the same as the server rack (300) and/or the server rack (200), discussed above in reference to FIG. 3 and FIG. 2, respectively. As shown in FIG. 4, the server rack (400) includes a frame (402) with multiple server slots (e.g., Server Slot A (404A), Server Slot B (404B), Server Slot C (404C), and Server Slot D (404D)). As also shown in FIG. 4, each server slot (404A, 404B, 404C, 404D) holds a chassis. Specifically, server slot A (404A) holds chassis A (406A), server slot B (404B) holds chassis B (406B), server slot C (404C) holds chassis C (406C), and sever slot D (404D) holds chassis D (406D). The server rack (400) also includes a rectifier (418) and a battery string (416). The server rack (400) may also include a controller (not shown).

Still referring to FIG. 4, the contents of chassis A (406A) includes server load A. Similarly, the contends of chassis B (406B) includes server load B. The server loads in FIG. 4 may be essentially the same as server load A (302A) and/or server load B (302B), discussed above in reference to FIG. 3. In other words, chassis A (406A) and chassis B (406B) are servers/server nodes.

In one or more embodiments of the invention, the contents of chassis C (406C) include an AC power distribution circuit (AC PDC) and multiple AC power supply circuits (AC PSCs). The AC PDC and AC PSCs in the server rack (400) may be essentially the same as AC PDC (310) and AC PSCs (304A, 304B), discussed above in reference to FIG. 3. Moreover, the incoming AC power supply (425) is operatively connected to the AC PDC through a port of chassis C (406C). The AC PSCs in chassis C (406C) are connected (e.g., using wires (499)) to the server loads in chassis A (406A) and chassis B (406B).

In one or more embodiments of the invention, the contents of chassis D (406D) include a DC power distribution circuit (DC PDC) and multiple DC power supply circuits (DC PSCs). The DC PDC and the DC PSCs in the server rack (400) may be essentially the same as DC PDC (312) and DC PSCs (306A, 306B), discussed above in reference to FIG. 3. Moreover, the rectifier (418) and battery string (416) are operatively connected to the DC PDC through a port of chassis D (406D). The DC PSCs in chassis D (406D) are connected (e.g., using wires (499)) to the server loads in chassis A (406A) and chassis B (406B).

In one or more embodiments of the invention, the rectifier (418) and/or the battery string (416) are also housed in a server slot (not shown) in the frame (402). In one or more embodiments of the invention, the server slot housing the battery string (416) and/or the rectifier (418) is larger than the other server slots and/or located on the bottom of the server rack (400).

Figure 5:
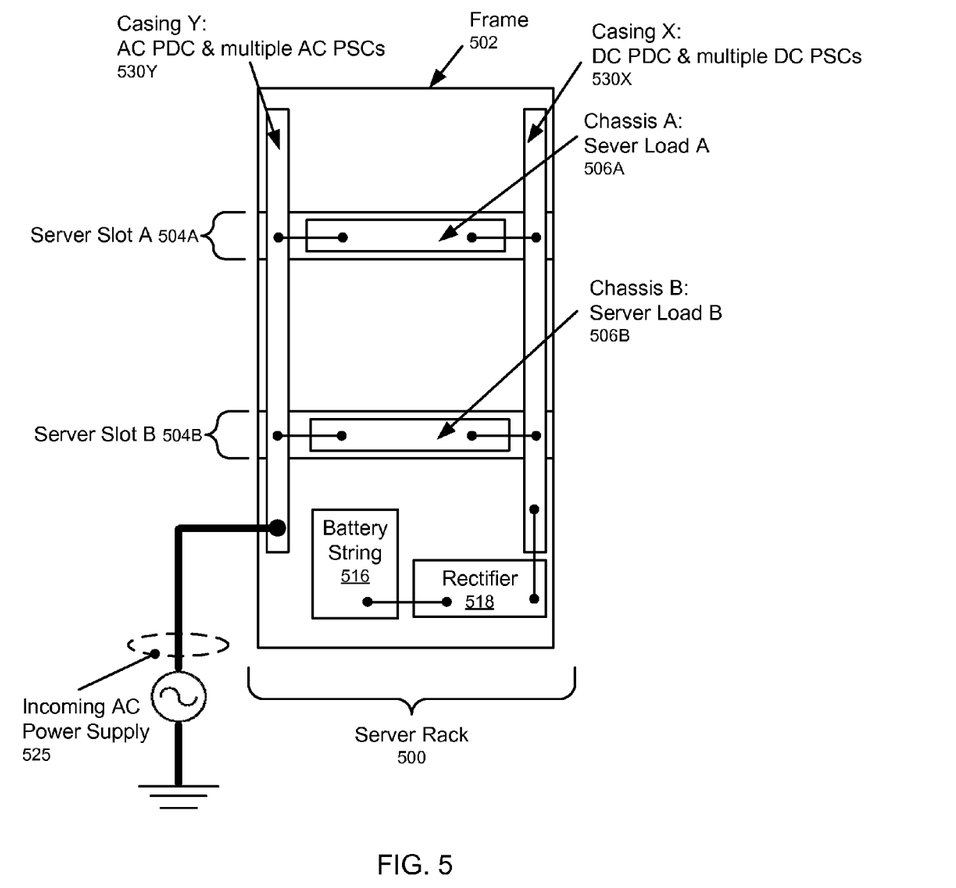

FIG. 5 shows a server rack (500) in accordance with one or more embodiments of the invention. The server rack (500) may be essentially the same as the server rack (300) and/or the server rack (200), discussed above in reference to FIG. 3 and FIG. 2, respectively. As shown in FIG. 5, the server rack (500) includes a frame (502) with multiple server slots (e.g. Server Slot A (504A), Server Slot B (504B)). As also shown in FIG. 5, each server slot (504A, 504B) holds a chassis. Specifically, server slot A (504A) holds chassis A (506A) and server slot B (504B) holds chassis B (506B). The server rack (500) also includes a rectifier (518) and a battery string (516). The server rack (500) may also include a controller (not shown).

Still referring to FIG. 5, the contents of chassis A (506A) includes server load A. Similarly, the contends of chassis B (506B) includes server load B. The server loads in FIG. 5 may be essentially the same as server load A (302A) and/or server load B (302B), discussed above in reference to FIG. 3. In other words, chassis A (506A) and chassis B (506B) are servers/server nodes.

In one or more embodiments of the invention, the server rack includes multiple casings (e.g., casing X (530X), casing Y (530Y)). The contends of casing X (530X) include a DC PDC and multiple PSCs. The DC PDC and multiple DC PSCs in the casing X (530X) may be essentially the same as DC PDC (312) and DC PSCs (306A, 306B), discussed above in reference to FIG. 3. Further, the rectifier (518) and battery string (516) are operatively connected to the DC PDC through a port(s) of casing X (530X). Further, AC PSCs in casing Y (530Y) are connected (e.g., using wires) to the server loads in chassis A (506A) and chassis B (506B).

In one or more embodiments of the invention, the contends of casing Y (530Y) include an AC PDC and multiple AC PSCs. The AC PDC and multiple AC PSCs in casing Y (530Y) may be essentially the same as AC PDC (310) and AC PSCs (304A, 304B), discussed above in reference to FIG. 3. Moreover, the incoming AC power supply (525) is operatively connected to the AC PDC through a port of casing Y (530Y). The AC PSCs in casing Y (530Y) are connected (e.g., using wires) to the server loads in chassis A (506A) and chassis B (506B).

In one or more embodiments of the invention, the rectifier (518) and/or the battery string (516) are also housed in a server slot (not shown) in the frame (502). In one or more embodiments of the invention, the server slot housing the battery string (516) and/or the rectifier (518) is larger than the other server slots and/or located on the bottom of the server rack (500).

Although all power circuits in FIG. 4 are housed in chassis (e.g., Chassis C (406C), Chassis D (406D)) and all power circuits in FIG. 5 are housed in casings (e.g., Casing X (530X), Casing Y (530Y)), in one or more embodiments of the invention, some power circuits are housed in a casing while other power circuits are housed in chassis. For example, a casing may be used to house only the DC PDC and the multiple DC PSCs. The AC PDC and the AC PSCs may be held in one or more chassis. As another example, a casing may be used to house only the AC PDC and the multiple AC PSCs. The DC PDC and the DC PSCs may be held in one or more chassis.

In one or more embodiments of the invention, one or more casings are used to house the AC PDC and the DC PDC. In such embodiments of the invention, one or more chassis, including chasing having server loads, are used to house the multiple AC PSCs and the multiple DC PSCs. In one or more embodiments of the invention, one or more chassis, including chasing having server loads, are used to house the AC PDC and the DC PDC. In such embodiments of the invention, one or more casings are used to house the multiple DC PSCs and the multiple AC PSCs.

Figure 6:
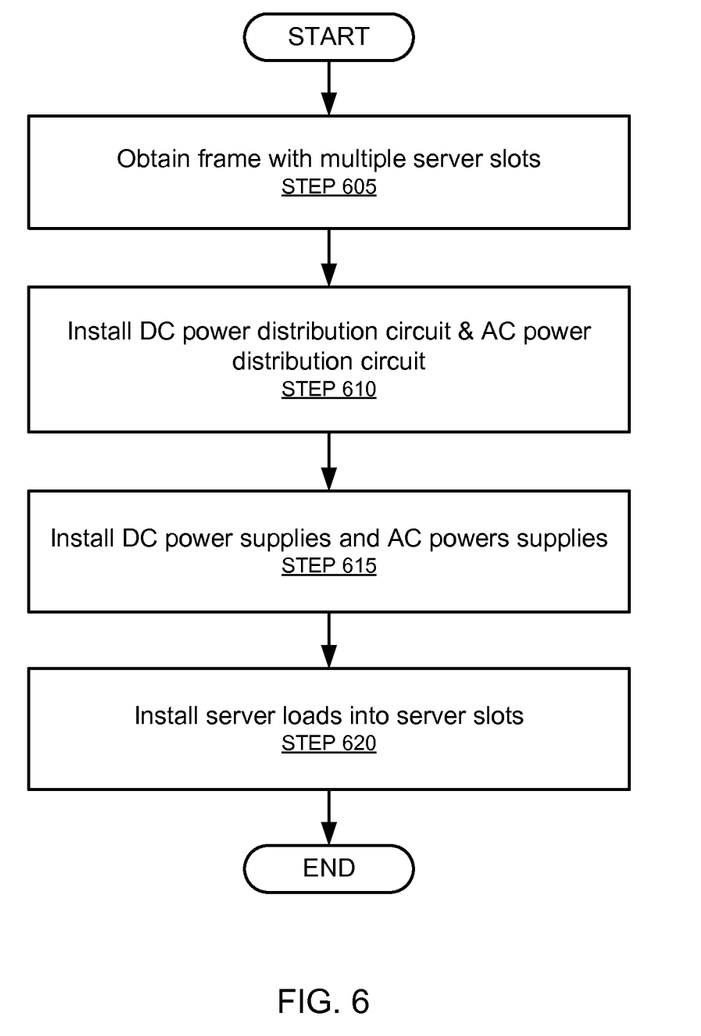
FIG. 6 shows a flowchart in accordance with one or more embodiments of the invention.

FIG. 6 shows a flowchart in accordance with one or more embodiments of the invention. The process described in FIG. 6 corresponds to a method of manufacturing a server rack (e.g., Server Rack (200), Server Rack (300), Server Rack (400), Server Rack (500), discussed above in reference to FIG. 2, FIG. 3, FIG. 4, and FIG. 5, respectively). One or more steps shown in FIG. 6 may be omitted, repeated, and/or performed in a different order among different embodiments of the invention. Accordingly, embodiments of the invention should not be considered limited to the specific number and arrangement of steps shown in FIG. 6.

Initially, a frame having multiple server slots is obtained (STEP 605). In one or more embodiments of the invention, the server slots are identical in size. In one or more embodiments of the invention, two or more of the server slots differ in size.

In STEP 610, the AC and DC power distribution circuits are installed into the frame. In one or more embodiments of the invention, installing the AC and/or DC power distribution circuits includes installing one or more chassis housing the AC and/or DC power distribution circuits into one or more server slots of the frame. In one or more embodiments of the invention, installing the AC and/or DC power distribution circuits includes securing one or more casings housing the AC and/or DC power distribution circuits to the side(s), top, and/or or bottom of the frame.

In STEP 615, the AC and DC power supply circuits are installed into the frame. In one or more embodiments of the invention, installing the AC and/or DC power supply circuits includes installing one or more chassis housing the AC and/or DC power supply circuits into one or more server slots of the frame. In one or more embodiments of the invention, installing the AC and/or DC power supply circuits includes securing one or more casings housing the AC and/or DC power supply circuits to the side(s), top, and/or bottom of the frame. It may be necessary to connect (e.g., wire), the power supply circuits with the power distribution circuits. STEP 615 and STEP 610 may be merged when the same chassis and/or the same casings house both power supply circuits and power distribution circuits.

In STEP 620, the server loads are installed into the frame. Specifically, the one or more chassis housing the one or more server loads are inserted into the server slots of the frame. It may be necessary to connect (i.e., wire) the server loads with the AC and/or DC power supply circuits. STEP 620 and STEP 615 may be merged when the one or more chassis housing the server loads also house the AC and/or DC power supply circuits. Further, it may be necessary to connect the AC power distribution circuit with an incoming AC power supply. Further still, it may be necessary to install batteries (if the server rack does not already have a battery string, rectifier, controller, etc.) and connect the batteries to the DC power distribution circuit.

In one or more embodiments of the invention, STEP 605, STEP 610, and STEP 615 are performed by the manufacturer of the server rack. STEP 620 may be performed by the end user of the server rack.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A server rack, comprising:
   a rectifier;
   a plurality of server slots;
   a first server load located in a first server slot of the plurality of server slots;
   a second server load located in a second server slot of the plurality of server slots;
   a first alternating current (AC) power supply circuit configured to supply power to the first server load;
   a second AC power supply circuit configured to supply power to the second server load;
   a first direct current (DC) power supply circuit configured to supply power to the first server load;
   a second DC power supply circuit configured to supply power to the second server load;
   a DC power distribution circuit electrically connecting the rectifier to the first DC power supply circuit and the second DC power supply circuit; and
   an AC power distribution circuit electrically connecting an incoming AC power supply to the first AC power supply circuit and the second AC power supply circuit.

2. The server rack of claim 1, further comprising:
   a chassis located in a third server slot of the plurality of server slots and comprising the DC power distribution circuit.

3. The server rack of claim 2, wherein the chassis further comprises:
   the first DC power supply circuit; and
   the second DC power supply circuit.

4. The server rack of claim 2, wherein the first AC power supply circuit and the first DC power supply circuit are located in the first server slot with the first server load.

5. The server rack of claim 1, further comprising:
   a chassis located in a third server slot of the plurality of server slots and comprising the AC power distribution circuit.

6. The server rack of claim 5, wherein the chassis further comprises:
   the first AC power supply circuit; and
   the second AC power supply circuit.

7. The server rack of claim 1, further comprising:
   a first casing positioned along a side of the server rack and comprising the DC power distribution circuit, the first DC power supply circuit, and the second DC power supply circuit.

8. The server rack of claim 7, further comprising:
   a second casing comprising the AC power distribution circuit, the first AC power supply circuit, and the second AC power supply circuit.

9. The server rack of claim 1, wherein the incoming AC power supply is a three-phase Y connected 480 VAC signal, wherein the rectifier delivers a 48 VDC signal to the DC power distribution circuit, wherein the first DC power supply circuit delivers a 12 VDC signal to the first server load, and wherein the second DC power supply circuit delivers a 12 VDC signal to the second server load.

10. The server rack of claim 1, further comprising:
    a chassis located in a third server slot of the plurality of server slots and comprising at least one selected from a group consisting of a battery string, a controller, and the rectifier.

11. The server rack of claim 1, wherein at least one selected from a group consisting of the AC power distribution circuit and the DC power distribution circuit is located in the first server slot with the first server load.

12. The server rack of claim 1, wherein the first server load is powered concurrently using the first AC power supply circuit and the first DC power supply circuit.

13. The server rack of claim 1, wherein the first server load is powered only using the first DC power supply circuit when the first AC power supply circuit is unavailable.

14. The server rack of claim 1, further comprising:
    a controller and a battery string;
    wherein the controller is configured to managing charging of the battery string, wherein the battery string is charged using power received from an incoming AC power supply;
    wherein the battery string is configured to provide DC power to the DC power distribution circuit.

15. A server rack, comprising:
    a battery string electrically connected to a controller and a rectifier;
    a plurality of server slots;
    a first server load located in a first server slot of the plurality of server slots;
    a second server load located in a second server slot of the plurality of server slots;
    a first alternating current (AC) power supply circuit located in a third server slot of the plurality of server slots and configured to supply power to the first server load;
    a second AC power supply circuit located in the third server slot and configured to supply power to the second server load;
    a first direct current (DC) power supply circuit located in a fourth server slot of the plurality of server slots and configured to supply power to the first server load;
    a second DC power supply circuit located in the fourth server slot and configured to supply power to the second server load;
    a DC power distribution circuit located in the fourth server slot and electrically connecting the rectifier to the first DC power supply circuit and the second DC power supply circuit; and
    an AC power distribution circuit located in the third server slot and electrically connecting an incoming AC power supply to the first AC power supply circuit and the second AC power supply circuit.

16. The server rack of claim 15, wherein the battery string is located in a fifth server slot of the plurality of server slots.

17. A method of manufacturing a server rack for securing a first server load and a second server load, comprising:
    obtaining a frame comprising a plurality of server slots;
    installing a rectifier into the frame;
    installing a direct current (DC) power distribution circuit into the frame; and
    installing an alternating current (AC) power distribution circuit into the frame;
    installing, within the frame, a first AC power supply circuit and a first DC power supply circuit configured to supply power to the first server load; and
    installing, within the frame, a second AC power supply circuit and a second DC power supply circuit configured to supply power to the second server load,
    wherein the DC power distribution circuit electrically connects the rectifier with the first DC power supply circuit and the second DC power supply circuit,
    wherein the AC power distribution circuit electrically connects an incoming AC power supply to the first AC power supply circuit and the second AC power supply circuit, and
    wherein the first AC power supply circuit converts a first AC voltage level, associated with the incoming AC power supply, to a second AC voltage level used by the first server load.

18. The method of claim 17, wherein the DC power distribution circuit is installed in a first server slot of the plurality of server slots, and wherein the second server load is located in a second server slot of the plurality of server slots.

19. The method of claim 18, wherein the first DC power supply circuit and the second DC power supply circuit are installed in the first server slot of the plurality of server slots.

20. The method of claim 17, wherein the AC power distribution circuit, the first AC power supply circuit, and the second AC power supply circuit are installed in a first server slot of the plurality of server slots, and wherein the second server load is located in a second server slot of the plurality of server slots.

21. The method of claim 17, wherein installing the AC power distribution circuit, the first AC power supply circuit, and the second AC power supply circuit comprises:
    securing a casing comprising the AC power distribution circuit, the first AC power supply circuit, and the second AC power supply circuit to a side of the frame.

22. The method of claim 17, wherein the DC power distribution circuit and the first DC power supply are installed in a first server slot of the plurality of server slots, wherein the first server load is located in the first server slot, and wherein the second server load is located in a second server slot of the plurality of server slots.

\* \* \* \* \*